（12） United States Patent
Waltari (10) Patent No.: US 8,654,000 B2
(45) Date of Patent: Feb. 18, 2014

(54) TIME-INTERLEAVED ANALOG-TO-DIGITAL CONVERTER FOR SIGNALS IN ANY NYQUIST ZONE

(75) Inventor: Mikko Waltari, Escondido, CA (US)

(73) Assignee: IQ-Analog, Inc., San Diego, CA (US)

( * ) Notice: Subject to any disclaimer, the term of this patent is extended or adjusted under 35 U.S.C. 154(b) by 0 days.

(21) Appl. No.: 13/603,495

(22) Filed: Sep. 5, 2012

(65) Prior Publication Data

US 2013/0069812 A1 Mar. 21, 2013

Related U.S. Application Data

(60) Provisional application No. 61/535,959, filed on Sep. 17, 2011.

(51) Int. Cl.
*H03M 1/34* (2006.01)
(52) U.S. Cl.
USPC .......................... 341/166; 341/141; 341/155
(58) Field of Classification Search
USPC .......................................... 341/155, 141, 166
See application file for complete search history.

(56) References Cited

U.S. PATENT DOCUMENTS 7,250,885 B1 * 7/2007 Nairn ............................ 341/141
7,532,684 B2 * 5/2009 Tietjen ........................... 375/316

OTHER PUBLICATIONS

Goodman et al., "Polyphase Nonlinear Equalization of Time-Interleaved Analog-to-Digital Converters," IEEE Journal of Selected Topics in Signal Processing, vol. 3, No. 3, Jun. 2009. pp. 362-373.
Harris et al., "Two Channel TI-ADC for Communication Signals", Signal Processing Advances in Wireless Communications (SPAWC), 2011 IEEE 12th International Workshop on Jun. 26-29, 2011, pp. 576-580.
Huang and Levy, "Adaptive blind calibration of timing offset and gain mismatch for two-channel time-interleaved ADCs," IEEE Trans. on Circuits and Systems-I: Regular Papers, vol. 53, No. 6, pp. 1278-1288, Jun. 2006.
Saleem and Vogel, "LMS-based identification and compensation of timing mismatches in a two-channel time interleaved analog-to-digital converter", Proc. IEEE Norchip Conf., pp. 1-4, Nov. 19-20, 2007.
Tertinek and Vogel, Reconstruction of Two-Periodic Nonuniformly Sampled Band-Limited Signals Using a Discrete-Time Differentiator and a Time-Varying Multiplier, Circuits and Systems II: Express Briefs, IEE Transactions on Jul. 2007. pp. 616-620, vol. 54, Issue 7.
U.S. Appl. No. 61/499,223, filed Jun. 21, 2011.
Vogel, et al, "Adaptive Blind Compensation of Gain and Timing Mismatches in M-Channel Time-Interleaved ADCs", Electronics, Circuits and Systems, 2008. ICECS 2008, 15th IEEE International Converence on Aug. 31, 2008-Sep. 3, 2008. pp. 49-52.

* cited by examiner

*Primary Examiner* — Jean B Jeanglaude
(74) *Attorney, Agent, or Firm* — The Mueller Law Office, P.C.

(57) ABSTRACT

Processing a signal by receiving an analog input signal located outside of a first Nyquist zone that is between 0 and fs/2; passing the analog input signal through an M-channel time-interleaved analog-to-digital converter (TI-ADC) to generate a TI-ADC output signal; and estimating and correcting a timing skew error in the TI-ADC output signal. Alternatively, an electronic circuit that includes an input for an analog input signal, an M-channel time-interleaved analog-to-digital converter (TI-ADC) and a timing skew error estimating and correcting circuitry. The analog input signal is located outside of a first Nyquist zone that is between 0 and fs/2. The TI-ADC receives the analog input signal and generates a TI-ADC output signal. The timing skew error estimating and correcting circuitry estimates and corrects a timing skew error in the TI-ADC output signal.

18 Claims, 7 Drawing Sheets

TIME-INTERLEAVED ANALOG-TO-DIGITAL CONVERTER FOR SIGNALS IN ANY NYQUIST ZONE

RELATED PATENT APPLICATION

This application claims priority to U.S. Provisional Patent Application No. 61/535,959 filed Sep. 17, 2011, entitled "Time-Interleaved Analog-to-Digital Converter for Signals in any Nyquist Zone," and which is hereby incorporated by reference for all purposes.

BACKGROUND OF THE INVENTION

Time-interleaving of two, or more, analog-to-digital converters (ADCs) is a common way to overcome the limits of hardware technology that affect the maximum sampling frequency $f_S$ for a single ADC. Time-interleaved analog-to-digital converters (TI-ADCs) offer a significant increase in the available sample rate of ADCs. In other words, for example, by using two TI-ADCs operating in parallel with a Ts time offset of their 2Ts time interval sampling clocks (i.e. a 180-degree phase shift in the sampling clocks), the overall sampling frequency of the system is doubled. In an ideal two-channel TI-ADC, aliasing terms formed by the individual ADCs, operating at half rate, are cancelled by the interleaving process. This canceling occurs because the aliased spectral component of the time offset ADC has the opposing phase of the same spectral component of the non-time offset ADC. In the absence of time offset and gain mismatch the sum of their spectra would cancel their alias components.

The performance of TI-ADCs is degraded by timing and gain mismatches. Most of the prior art on mismatch estimation and correction in TI-ADCs is concentrated on low-pass converting base-band signals. Modern system designs lean towards having the TI-ADC interface with intermediate frequency (IF) centered signals in the analog section of a digital receiver rather than the DC (base-band) centered, analog down converted, in-phase and quadrature pair. In many cases the IF is located above the $f_S/2$ and the sampling process directly down-converts the band-pass input signal to the frequency range from 0 to $f_S/2$. This process is called sub-sampling or band-pass sampling.

The sample instants of the individual time-interleaved ADCs are affected by an unknown and possibly slowly varying with environment time delay, $\Delta t_m$, which results in an undesired frequency dependent phase offset of their aliased spectra that prevents their perfect cancellation at the output of a time multiplexer. Mismatches in path gains, $g_m$, of the TI-ADC, due to the tolerance spread of analog components, are always present in the ADC's hardware. The gain mismatch contributes a non frequency dependent imperfect cancellation of the spectral components at the output of the TI-ADC system.

In order to correct the artifacts caused by the time and gain offsets, the artifacts must first be estimated. Estimation methods can be divided in two categories:

Foreground techniques, also known as non-blind techniques, that inject a known test or probe signal to estimate the mismatches by measuring the TI-ADC output responses to the probe; and Background techniques, also known as blind techniques, for which no information is required about the input signal (except perhaps for some knowledge about the presence or absence of signal activity in certain frequency bands) in order to estimate the mismatches.

The first approach has the disadvantage that normal TI-ADC operations are suspended during the probe while in the second approach the calibration process does not interrupt normal operation.

In other words, a common problem is the removal of undesired signal artifacts related to timing and gain imbalances between interleaved analog-to-digital converters. This problem is addressed by a number of algorithmic approaches. These include direct and indirect approaches. In the direct approach, spectral artifacts related to timing imbalance are detected and the timing clocks are adjusted in the direction that reduces the size of the spectral artifacts. In the indirect approach, spectral artifacts related to timing imbalance are detected and the converter's digital samples are altered in adaptive filters to reduce the size of the spectral artifacts. Similarly, spectral artifacts related to gain imbalances are detected and the gains of the analog paths are altered to reduce the error size in the analog domain (direct approach) or the converted samples are gain corrected in the sampled data domain to reduce the error size related to gain imbalance.

The existing timing skew correction structures for time-interleaved ADCs work only for analog input signals that are located in the first Nyquist zone (i.e. between 0 and fs/2). Such solutions can be based on digital filters with fractional sample delay or use a canceling structure based on a derivative filter.

Figure 1:
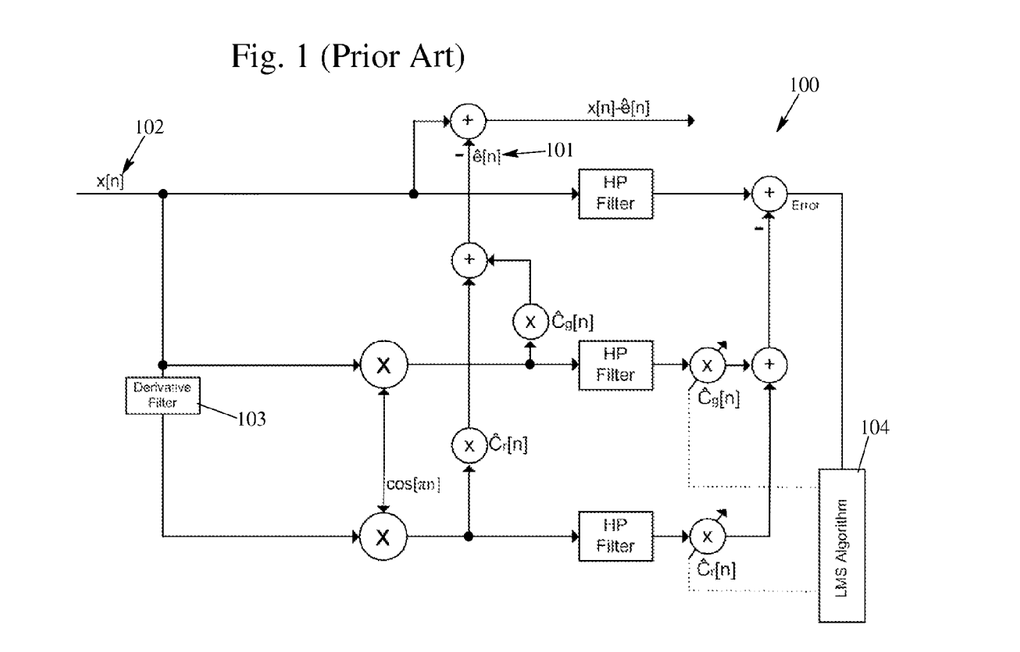
FIG. 1 is an example prior art detection and correction structure for a two channel TI-ADC.

A prior art detection and correction structure 100 for a two channel TI-ADC is shown in FIG. 1. The basic idea in this case is generally based on the recognition that when the analog signal is sampled, the timing skew causes an error that is approximately proportional to the signal derivative multiplied by the timing skew. This approximation holds well when the skew is small compared to the inverse of the signal frequency, which is generally true. The correction structure creates an estimate of the error signal 101 and subtracts it from the TI-ADC output signal 102. The error signal estimate 101 is generated by taking a derivative (at 103) of the digital TI-ADC output signal 102 and using an LMS (least mean square) algorithm (at 104) to find an estimate for the timing skew.

Figure 2:
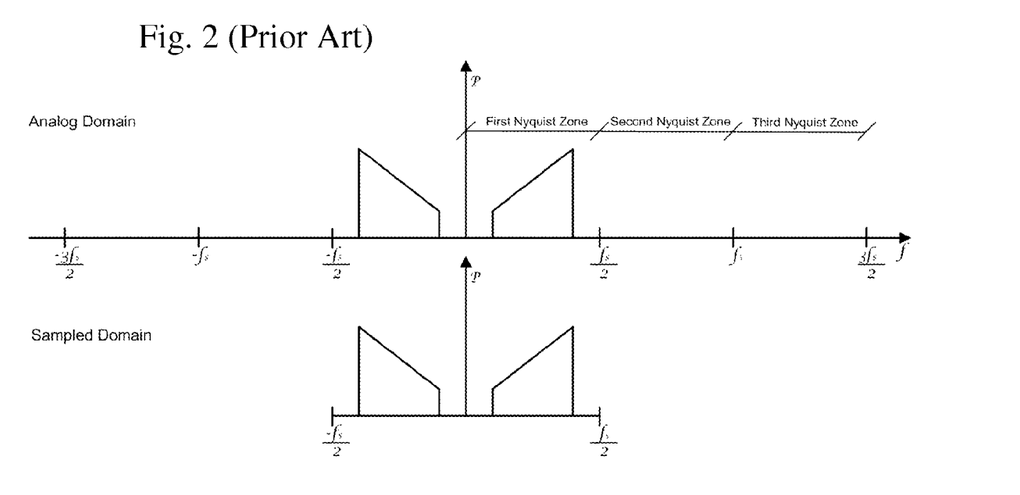
FIGS. 2-4 are example prior art spectra of TI-ADC input signals and corresponding TI-ADC output signals.
Figure 3:
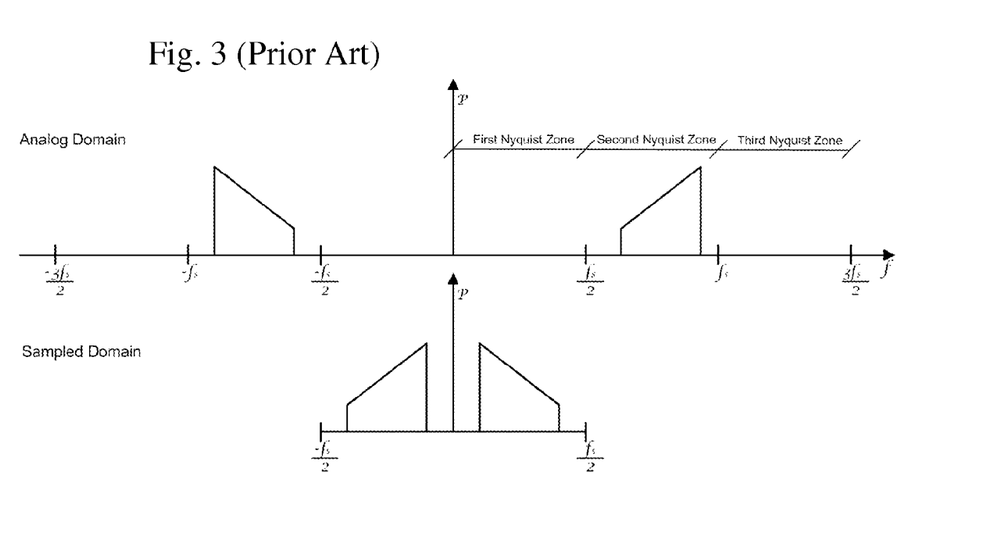
Figure 4:
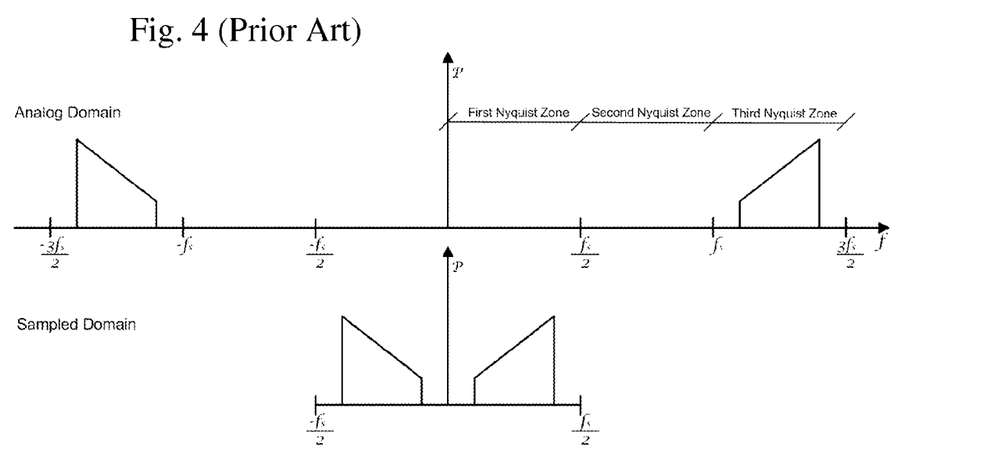

In the sampled domain signals only up to $f_S/2$ can be uniquely represented. For instance, two signals at different frequencies f and $f_S+f$ in the continuous time domain (TI-ADC input) both appear at the same frequency f in the sampled domain. This is illustrated in FIGS. 2-4, which show the spectrum of the TI-ADC input signal (analog domain) and the spectrum of the corresponding TI-ADC output signal (sampled domain). One can see that input signal in the range from 0 to $f_S/2$ (FIG. 2) results in an output signal that is identical to one produced by an input signal in the range from $f_S$ to $3f_S/2$ (FIG. 4). An input signal in the range from $f_S/2$ to $f_S$ (FIG. 3) undergoes the same down conversion process, but with additional spectral inversion.

For the reason described above the output of the derivative filter 103 (FIG. 1) operating on the sampled data used in the prior art correction method can reasonably match the derivative of the analog signal only when its highest frequency component is less than $f_S/2$.

SUMMARY OF THE INVENTION

Processing a signal by receiving an analog input signal located outside of a first Nyquist zone that is between 0 and fs/2; passing the analog input signal through an M-channel time-interleaved analog-to-digital converter (TI-ADC) to generate a TI-ADC output signal; and estimating and correcting a timing skew error in the TI-ADC output signal. Alternatively, an electronic circuit that includes an input for an analog input signal, an M-channel time-interleaved analog-to-digital converter (TI-ADC) and a timing skew error estimating and correcting circuitry. The analog input signal is located outside of a first Nyquist zone that is between 0 and $f_s/2$. The TI-ADC receives the analog input signal and generates a TI-ADC output signal. The timing skew error estimating and correcting circuitry estimates and corrects a timing skew error in the TI-ADC output signal.

DETAILED DESCRIPTION OF THE INVENTION

Embodiments of the present invention incorporate an indirect method to perform the timing skew correction. The technique can be used together with different estimation methods described in the prior art above. In general, the present invention provides a method to do timing skew correction for any Nyquist zone, i.e. for input signals (e.g. communication signals, radar signals, imaging signals, etc.) that are above $f_s/2$. This scenario is typical, for example, in cellular base station receivers, where the signal digitization is done from a high intermediate frequency (IF). For instance, the signal bandwidth can be 100 MHz, centered at 225 MHz, and sampled at 300 MHz. In this case, the signal is in the second Nyquist zone (i.e. between $f_s/2$ and $f_s$).

Some embodiments of the present invention generally build upon apparatuses and techniques described in C. Vogel, S. Saleem, and S. Mendel, "Adaptive blind compensation of gain and timing mismatches in M-channel time-interleaved ADCs," in Proc. 14th IEEE ICECS, pp. 4952, September 2008, and in U.S. Provisional Patent Application No. 61/499,223 filed Jun. 21, 2011. The C. Vogel reference and United States Provisional Patent Application Number 61/499,223 are incorporated herein by reference.

Some embodiments of the present invention are generally based on the idea that the TI-ADC input signal is considered to be a band-pass signal, whose bandwidth fulfills the Nyquist sampling criterion, i.e. is less than $f_s/2$. If the signal is located in the first Nyquist zone, for example, it can be defined having a carrier frequency of 0. If the signal is in the second Nyquist zone, however, the carrier frequency is $f_s/2$, and if it is in the third Nyquist zone the carrier frequency is $f_s$, and so on. After sampling, all these signals appear at carrier frequency of 0 in the sampled domain in the prior art (see FIGS. 2-4).

The error caused by the timing skew for this kind of signal can be split into two components. The first component is proportional to the derivative of the band-pass signal at carrier frequency of 0. With the definition of the carrier frequency as described before, this component can be corrected using the prior art structure. The second error component is proportional to the band-pass signal (at carrier frequency of 0) phase shifted by 90 degrees and multiplied by a constant which is proportional to the original carrier frequency. Some embodiments of the present invention generally provide a method to cancel this second error component.

Some embodiments of the present invention generally use a Hilbert transform filter to create the 90 degrees phase shifted version of the TI-ADC output signal. This signal is multiplied by the estimate of the timing skew and a constant whose value depends on the Nyquist zone where the input signal is located. The value of the constant is: $(-1)\lfloor k/2 \rfloor \pi$, where k represents the Nyquist zone (1, 2, 3, . . . ) and the brackets ($\lfloor \rfloor$) denote rounding towards zero. Generally the user of the TI-ADC knows the location of the input signal and can provide this constant as a parameter to the structure. This estimate of the second error component is added together with the first one before subtracting it from the TI-ADC output.

Figure 5:
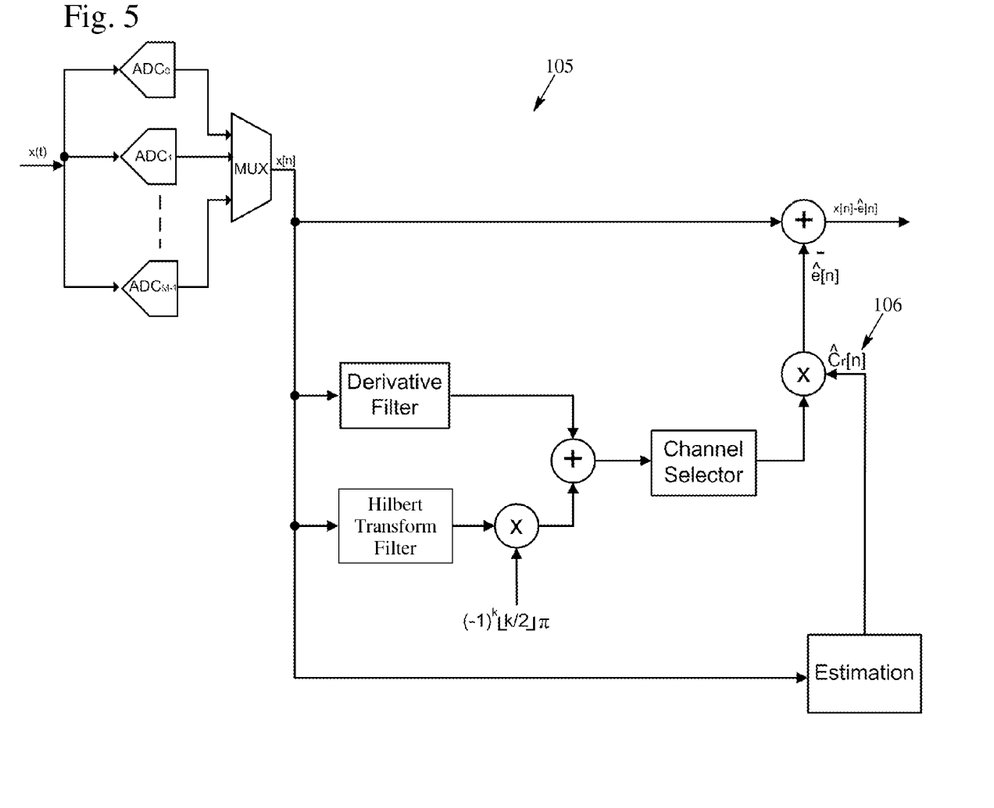
FIG. 5 is a simplified block diagram of an example timing skew correction structure for an M-channel TI-ADC incorporating an embodiment of the present invention.
Figure 6:
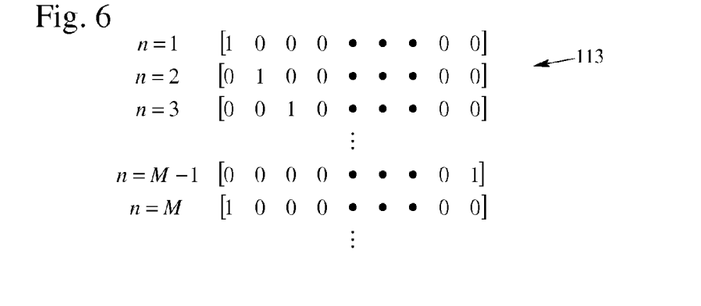
FIG. 6 is a time varying M-periodic channel selection vector table for use with an embodiment of the present invention.

A block diagram of an example timing skew correction structure 105 incorporating an embodiment of the present invention for an M-channel TI-ADC is shown in FIG. 5. Every TI-ADC channel has its unique correction coefficient 106, which is represented in vector form $\hat{C}_r = [\hat{C}_{r1} \hat{C}_{r2} \ldots \hat{C}_{rM}]^T$ and selected for use with samples captured by that particular channel by multiplying the signal samples by a time varying M-periodic channel selection vector 113, as shown in FIG. 6.

The present invention is generally separate from and independent of the method for obtaining the estimate of the timing skew. For example, the estimate of the timing skew can be obtained with the LMS method of the prior art or by some other appropriate means.

Figure 7:
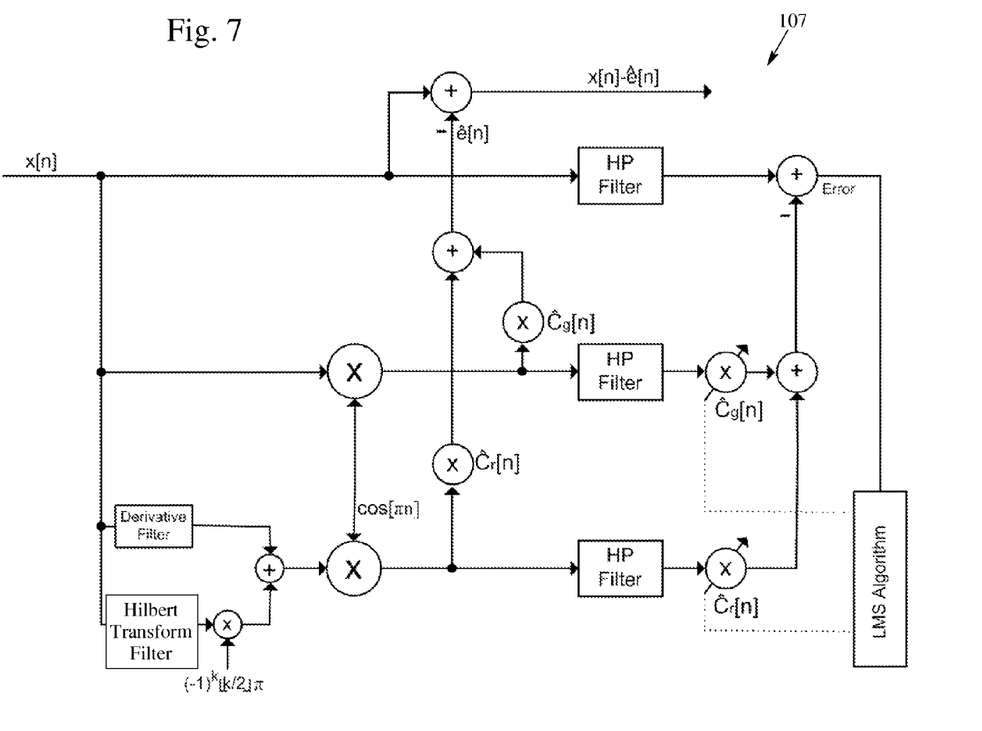
FIG. 7 is a simplified block diagram of an example two-channel TI-ADC estimation and correction structure incorporating an embodiment of the present invention.

Whereas the example timing skew correction structure 105 of FIG. 5 represents a generic use of an embodiment of the present invention with an M-channel TI-ADC and an unspecified timing skew estimation method; FIG. 7 shows an example embodiment of the present invention applied in a two-channel TI-ADC estimation and correction structure 107.

Figure 8:
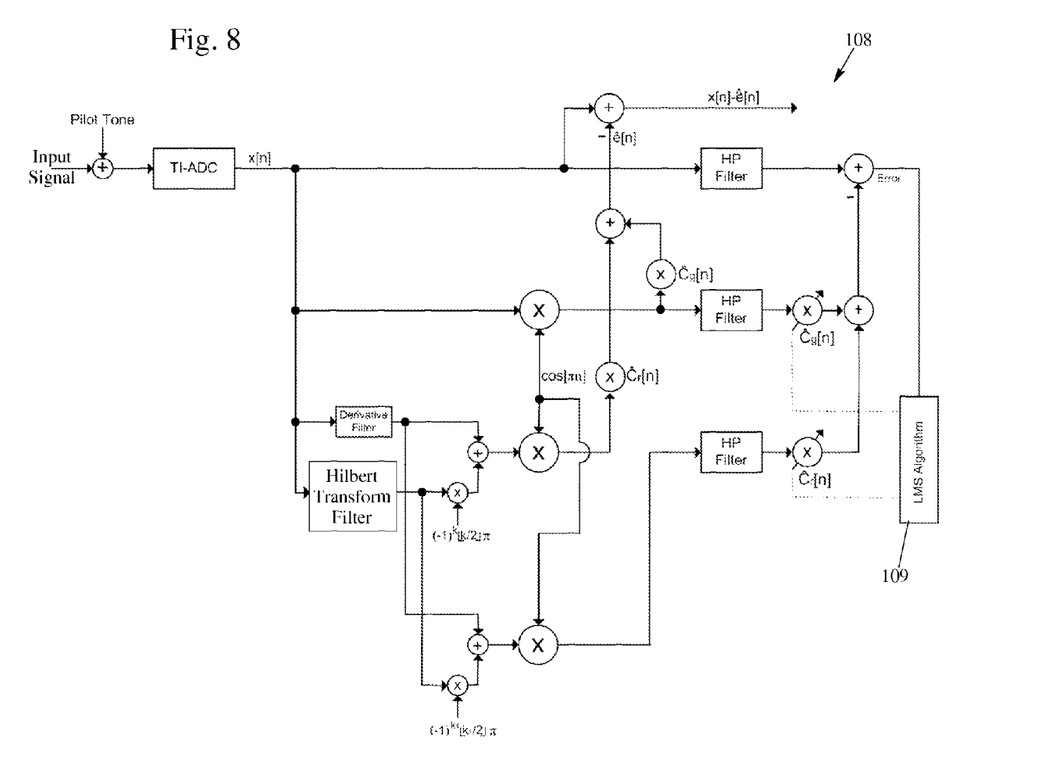
FIG. 8 is a simplified block diagram of an example two-channel TI-ADC estimation and correction structure incorporating an embodiment of the present invention in which a pilot tone is in one Nyquist zone and a band-pass input signal is in another Nyquist zone.

When embodiments of the present invention are used with a pilot tone based error estimation scheme (see prior U.S. Provisional Patent Application No. 61/499,223), the frequency of the pilot tone doesn't need to be in the same Nyquist zone as the band-pass input signal. FIG. 8 shows a two-channel TI-ADC estimation and correction structure 108 for an embodiment in which the pilot tone is in one Nyquist zone and the band-pass input signal is in some other Nyquist zone. A proper derivative for the pilot tone is obtained with a different value of k than the one used for the band-pass input signal. For this reason a second independent signal path with a different constant ($k_1$) is used as an input for the LMS algorithm block 109, which relies on the pilot tone for timing-skew estimation.

An alternative embodiment involves removing the ambiguity of the sampled domain signal frequency by up-sampling the TI-ADC output signal with a factor large enough to bring the analog input signal frequency below the $f_s/2$ of the new sampling rate. The right spectral copy, which depends on the Nyquist zone where the analog signal is located, is selected with a band-pass filter. In this case, it is possible to digitally form a derivative that matches the analog one or use other correction methods such as those based on fractional delays.

Figure 9:
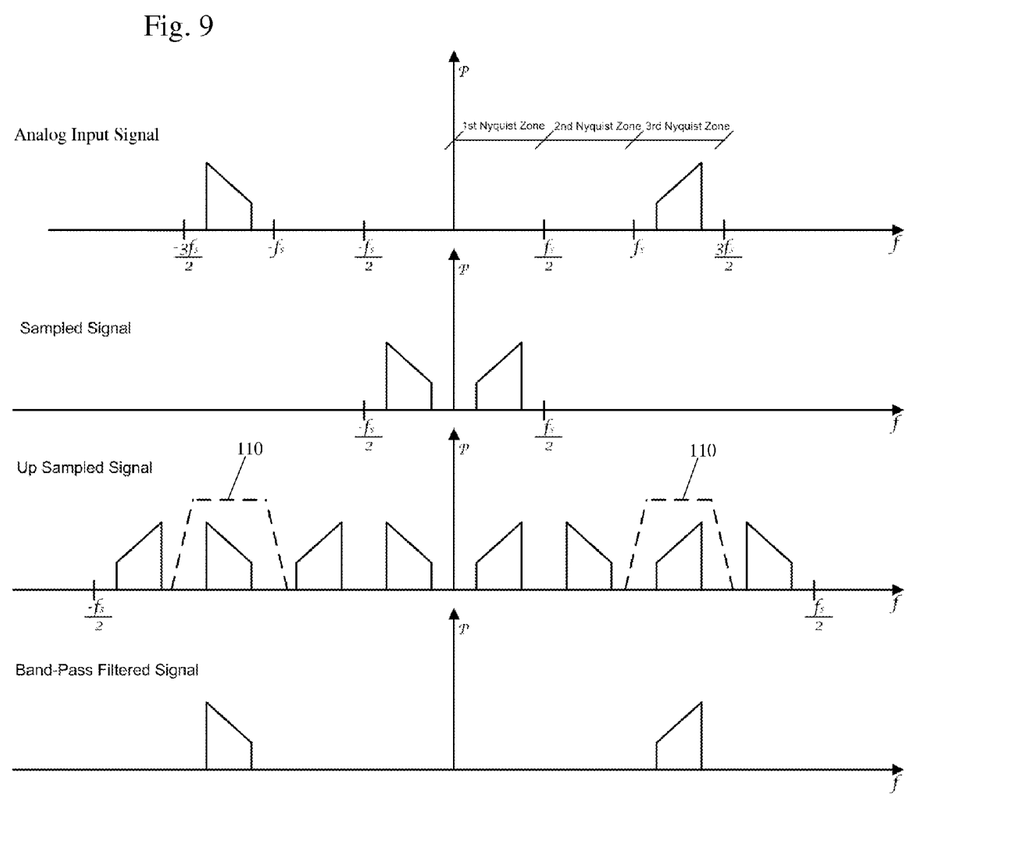
FIG. 9 is an example signal spectrum generated at different stages of a process according to an alternative embodiment of the present invention.

An example of this alternative embodiment is shown in FIG. 9, wherein the signal spectra at different stages of the process are depicted. The "analog input signal" is located in the third Nyquist zone (i.e. from $f_S$ to $3f_S/2$) and after sampling it (i.e. "sampled signal" or TI-ADC output signal) appears in the frequency range from 0 to $f_S/2$. The sampled signal is up-sampled by four by inserting three zero samples between each original data sample. The result is a signal at four times higher sampling frequency consisting of four spectral copies (i.e. "up sampled signal") of the original TI-ADC output signal. The copy (inside dashed lines 110) that has the same frequency location as the TI-ADC analog input signal is selected with a band-pass filter. The result is a discrete time signal (i.e. "band-pass filtered signal") that matches the original TI-ADC analog input signal.

Figure 10:
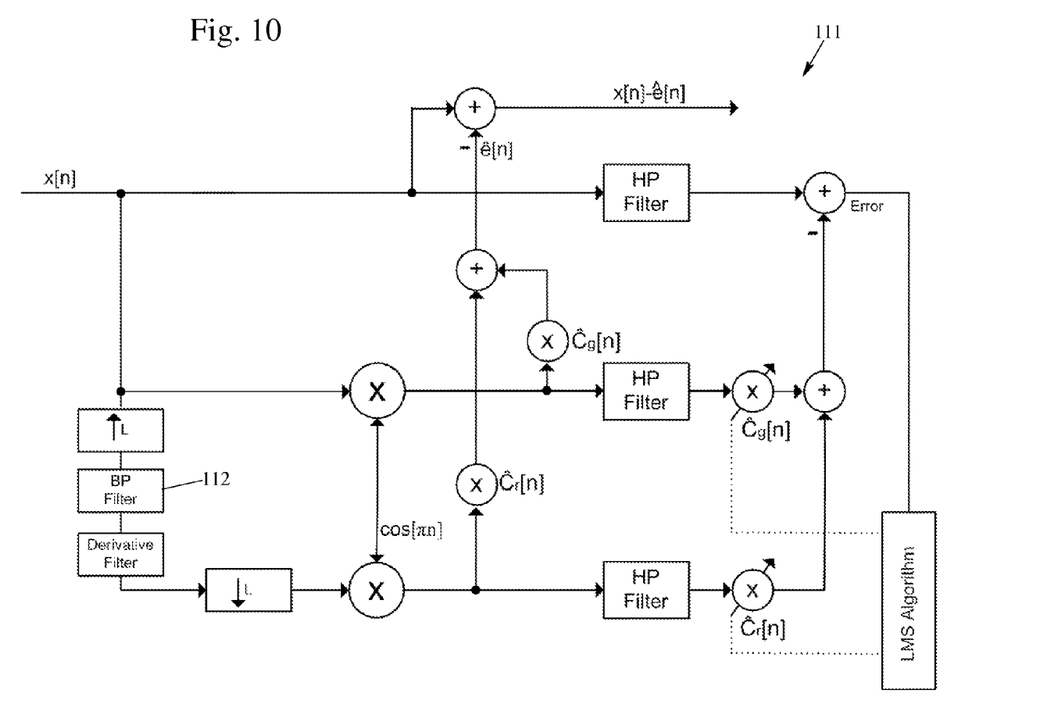
FIG. 10 is a simplified block diagram of an example two-channel TI-ADC estimation and correction structure incorporating the alternative embodiment of the present invention for generating the example signal spectrum shown in FIG. 9.

FIG. 10 shows an example two-channel TI-ADC estimation and correction structure 111 incorporating the alternative embodiment of the present invention for generating the example signal spectra shown in FIG. 9. A potential downside of this embodiment compared to that based on the Hilbert transform filter (FIGS. 5, 7 and 8) is that parts of the correction structure, including a band-pass filter 112 selecting the correct spectral copy, run at a much higher sample rate that potentially leads to a more costly hardware implementation in terms of power and silicon area.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art without departing from the spirit and scope of the present invention. Furthermore, those of ordinary skill in the art will appreciate that the foregoing description is by way of example only, and is not intended to limit the invention. Thus, it is intended that the present subject matter covers such modifications and variations as come within the scope of the specification.

The invention claimed is:

1. A method for processing a signal, the method comprising the steps of:
   receiving an analog input signal located outside of a first Nyquist zone that is between 0 and $f_S/2$;
   passing the analog input signal through an M-channel time-interleaved analog-to-digital converter (TI-ADC) to generate a TI-ADC output signal; and
   estimating and correcting a timing skew error in the TI-ADC output signal by creating a 90-degrees phase shifted version of the TI-ADC output signal, and multiplying the phase shifted version of the TI-ADC output signal by an estimate of the timing skew and a constant that depends on the Nyquist zone of the analog input signal.

2. The method of claim 1, further comprising the steps of:
   up-sampling the TI-ADC output signal to form multiple spectral copies of the TI-ADC output signal;
   selecting one of the spectral copies that has a same frequency location as the analog input signal; and
   estimating and correcting the timing skew error in the selected spectral copy.

3. The method of claim 1, wherein:
   a Hilbert transform filter creates the 90 degrees phase shifted version of the TI-ADC output signal.

4. The method of claim 1, wherein:
   a value of the constant is: $(-1)^k \lfloor k/2 \rfloor \pi$, where k represents the Nyquist zone of the analog input signal and brackets ($\lfloor \rfloor$) denote rounding towards zero.

5. The method of claim 1, wherein the estimating and correcting further comprises:
   generating a first estimated error component that is proportional to a derivative of the analog input signal at carrier frequency of 0;
   generating a second estimated error component that is proportional to the analog input signal phase shifted by 90-degrees and multiplied by a constant which is proportional to an original carrier frequency of the analog input signal; and
   subtracting the first and second estimated error components from the TI-ADC output signal.

6. The method of claim 1, wherein each of the M channels has a unique correction coefficient.

7. The method of claim 1, wherein M>2.

8. The method of claim 1, further comprising the step of:
   inserting a pilot tone in the analog input signal;
   and wherein the estimating and correcting utilizes the pilot tone.

9. The method of claim 8, wherein the pilot tone is in a different Nyquist zone than that of the analog input signal.

10. An electronic circuit comprising:
    an input for an analog input signal located outside of a first Nyquist zone that is between 0 and $f_S/2$;
    an M-channel time-interleaved analog-to-digital converter (TI-ADC) that receives the analog input signal and generates a TI-ADC output signal; and
    a timing skew error estimating and correcting circuitry that estimates and corrects a timing skew error in the TI-ADC output signal by creating a 90-degrees phase shifted version of the TI-ADC output signal and multiplying the phase shifted version of the TI-ADC output signal by an estimate of the timing skew and a constant that depends on the Nyquist zone of the analog input signal.

11. The electronic circuit of claim 10, further comprising:
    a pilot tone that is inserted in the analog input signal;
    and wherein the timing skew error estimating and correcting circuitry utilizes the pilot tone.

12. The electronic circuit of claim 11, wherein the pilot tone is in a different Nyquist zone than that of the analog input signal.

13. The electronic circuit of claim 10, further comprising:
    a Hilbert transform filter that creates the 90 degrees phase shifted version of the TI-ADC output signal.

14. The electronic circuit of claim 10, wherein:
    a value of the constant is: $(-1)^k \lfloor k/2 \rfloor \pi$, where k represents the Nyquist zone of the analog input signal and brackets ($\lfloor \rfloor$) denote rounding towards zero.

15. The electronic circuit of claim 10, wherein the timing skew error estimating and correcting circuitry:
    generates a first estimated error component that is proportional to a derivative of the analog input signal at carrier frequency of 0;
    generates a second estimated error component that is proportional to the analog input signal phase shifted by 90-degrees and multiplied by a constant which is proportional to an original carrier frequency of the analog input signal; and subtracts the first and second estimated error components from the TI-ADC output signal.

16. The electronic circuit of claim 10, wherein each of the M channels has a unique correction coefficient.

17. The electronic circuit of claim 10, wherein M>2.

18. An electronic circuit for processing a signal comprising:
   a means for receiving an analog input signal located outside of a first Nyquist zone that is between 0 and $f_s/2$;
   an M-channel time-interleaved analog-to-digital converter (TI-ADC) means for receiving the analog input signal and generating a TI-ADC output signal;
   a means for up-sampling the TI-ADC output signal to form multiple spectral copies of the TI-ADC output signal;
   a means for selecting one of the spectral copies that has a same frequency location as the analog input signal; and
   a means for estimating and correcting the timing skew error in the selected spectral copy.

* * * * *